(12) United States Patent
Lemke et al.

(10) Patent No.: US 6,450,824 B1
(45) Date of Patent: Sep. 17, 2002

(54) CONNECTOR INCLUDING MOVABLE COVER

(75) Inventors: Timothy A. Lemke, Dillsburg; Lewis R. Johnson, Liverpool, both of PA (US)

(73) Assignee: FCI Americas Technology, Inc., Reno, NV (US)

(*) Notice: Subject to any disclaimer, the term of this patent is extended or adjusted under 35 U.S.C. 154(b) by 0 days.

(21) Appl. No.: 09/631,377

(22) Filed: Aug. 3, 2000

Related U.S. Application Data

(60) Provisional application No. 60/147,118, filed on Aug. 4, 1999, and provisional application No. 60/147,120, filed on Aug. 4, 1999.

(51) Int. Cl.⁷ .......................................... H01R 13/625
(52) U.S. Cl. ...................................... 439/342; 439/70
(58) Field of Search ....................... 439/80–83, 259, 439/342, 263, 264, 268, 70, 71

(56) References Cited

U.S. PATENT DOCUMENTS

| | | | |
|---|---|---|---|
| 4,330,163 A | | 5/1982 | Aikens et al. |
| 4,422,703 A | * | 12/1983 | Christensen et al. ........ 439/342 |
| 4,468,076 A | | 8/1984 | Hine et al. |
| 4,501,461 A | | 2/1985 | Anhalt |
| 4,679,118 A | * | 7/1987 | Johnson et al. ......... 439/487 X |
| 4,761,140 A | * | 8/1988 | Geib ........................... 439/71 |
| 4,832,611 A | | 5/1989 | Noda et al. .................... 439/70 |
| 4,887,974 A | | 12/1989 | Ichimura et al. ............ 439/259 |
| 5,044,973 A | * | 9/1991 | Noda et al. ................. 439/296 |
| 5,254,012 A | * | 10/1993 | Wang .................... 439/259 X |
| 5,370,549 A | * | 12/1994 | Lee .............................. 439/342 |
| 5,518,410 A | | 5/1996 | Masami ....................... 439/71 |
| 5,547,389 A | | 8/1996 | Hsu |
| 5,611,705 A | | 3/1997 | Pfaff ........................... 439/266 |
| 5,628,636 A | | 5/1997 | Ollivier |
| 5,702,256 A | | 12/1997 | Severn |
| 5,762,511 A | * | 6/1998 | Scheitz et al. .............. 439/342 |
| 5,973,924 A | | 10/1999 | Gillespie, Jr. ............... 361/735 |
| 6,022,236 A | | 2/2000 | McHugh et al. ............ 439/342 |
| 6,024,584 A | | 2/2000 | Lemke et al. |
| 6,059,596 A | * | 5/2000 | Pei et al. ..................... 439/342 |
| 6,077,099 A | | 6/2000 | Pei et al. ..................... 439/342 |
| 6,086,386 A | * | 7/2000 | Fjelstad et al. ............... 439/70 |
| 6,093,035 A | | 7/2000 | Lemke et al. |
| 6,093,042 A | | 7/2000 | Lemke et al. |
| 6,113,412 A | | 9/2000 | Lin ............................ 439/342 |
| 6,217,361 B1 | * | 4/2001 | Murr .......................... 439/342 |
| 6,220,870 B1 | | 4/2001 | Barabi et al. ................. 439/71 |

* cited by examiner

Primary Examiner—Tulsidas Patel
(74) Attorney, Agent, or Firm—Woodcock Washburn LLP

(57) ABSTRACT

An electrical connector, comprising: a frame; a housing; and a cover. A contact extends through the housing, which secures to the frame. The cover secures to the frame and moves relative to the housing between a first position and a second position. An electrical connector may connect an electrical component having a terminal to a substrate having a conductive element. The housing has: a contact mounted to the substrate and adapted to engage a terminal of the electrical component, and guidance structure. The frame mounts to the substrate and supports the housing. An insert mounts to an opening in the cover and includes guidance structure corresponding to the guidance structure on the housing.

18 Claims, 16 Drawing Sheets

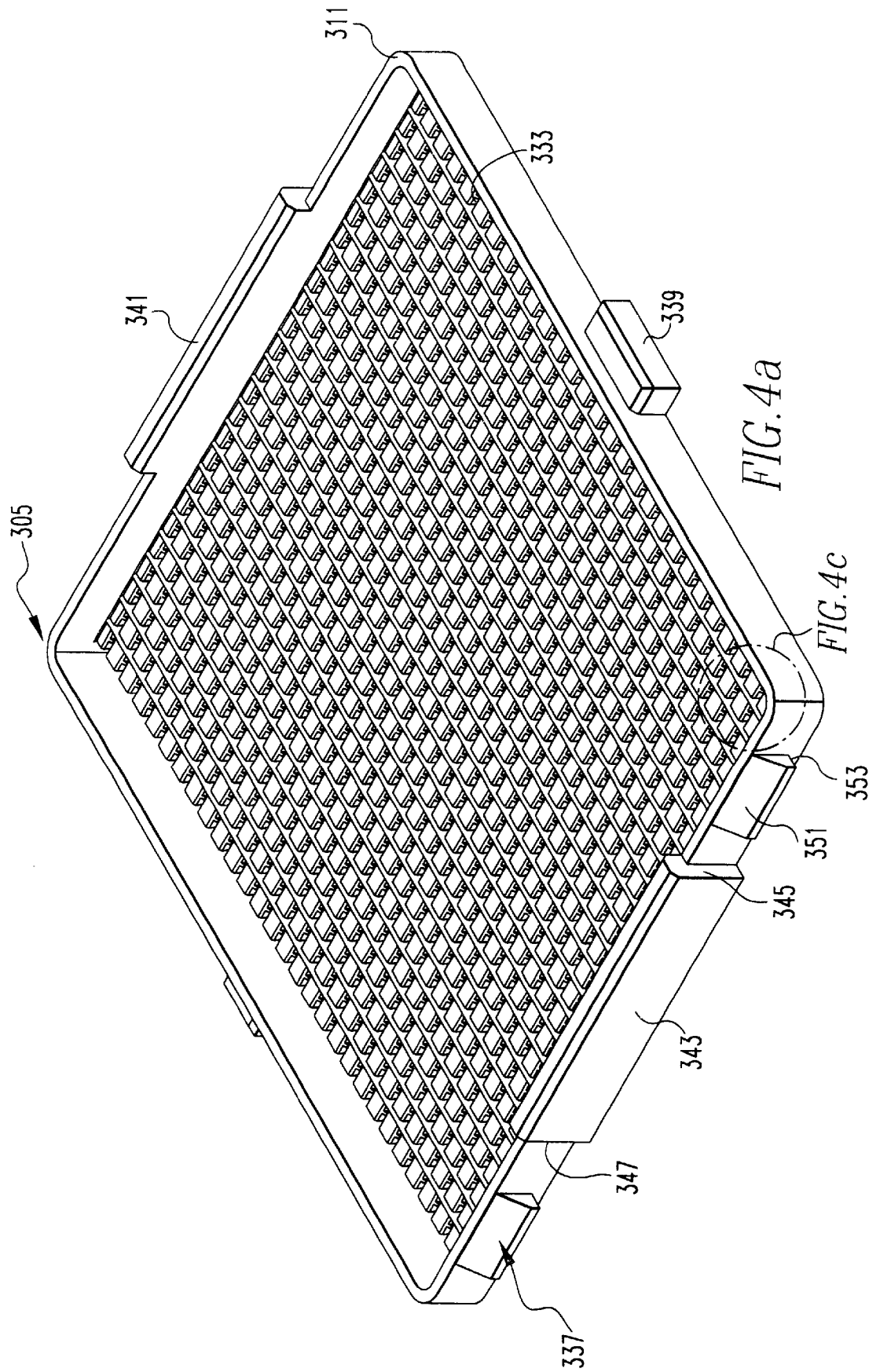

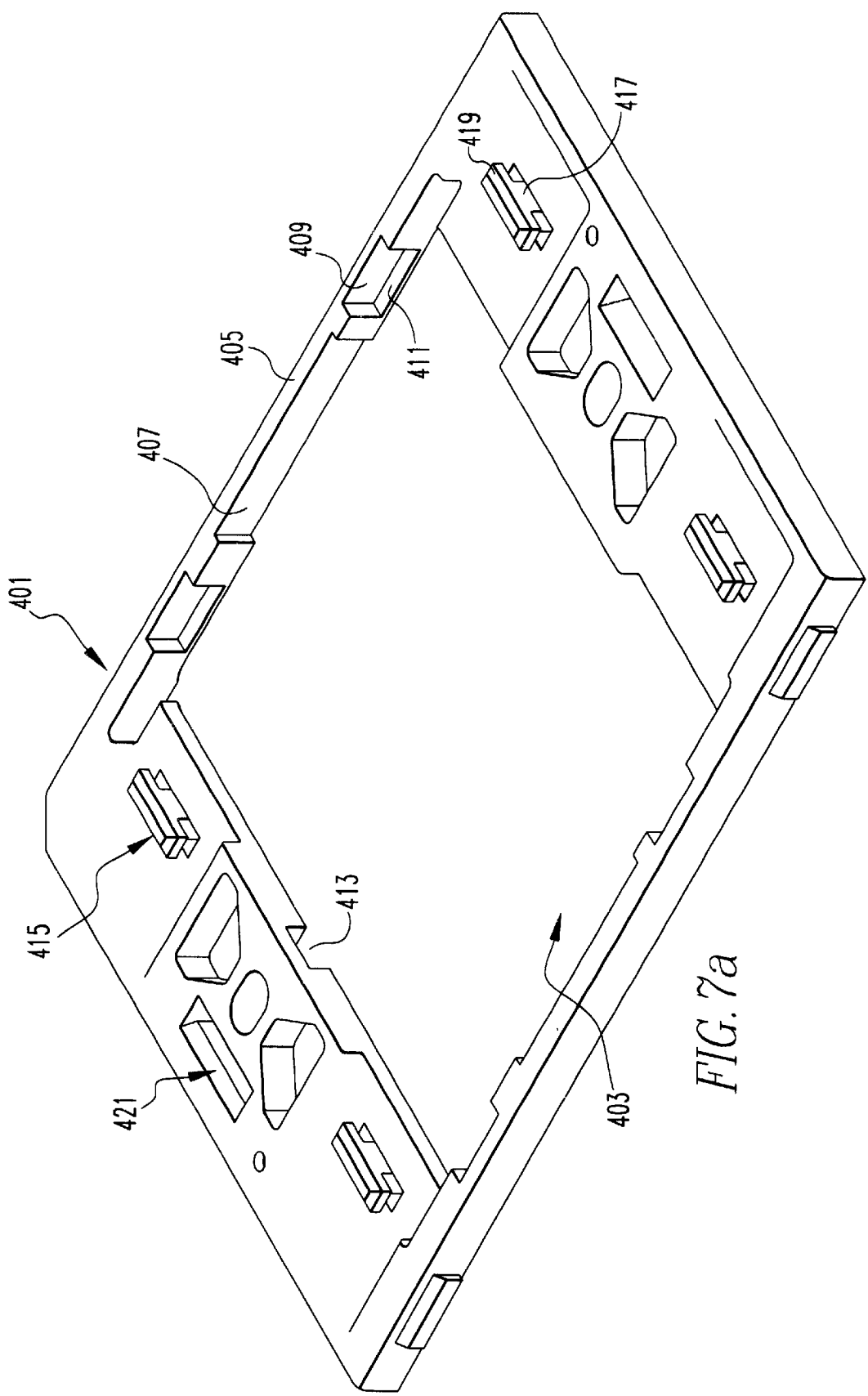

CONNECTOR INCLUDING MOVABLE COVER

CROSS-REFERENCE TO RELATED APPLICATIONS

This application claims priority to U.S. Provisional Patent Application No. 60/147,118, filed on Aug. 4, 1999, and No. 60/147,120, filed on Aug. 4, 1999, both of which herein incorporated by reference.

BACKGROUND OF INVENTION

1. Field of the Invention

The present invention relates to electrical connectors. More specifically, the present invention relates to zero insertion force (ZIF) sockets.

2. Brief Description of Earlier Developments

A common application for ZIF sockets involves connecting a microprocessor to a circuit board. Each subsequent microprocessor generation poses greater demands on the socket design. For example, new microprocessor may require smaller centerline spacing between contacts, greater pin count, increased coplanarity or decreased mating height. While conventional socket designs provide suitable results for existing microprocessors, these socket designs may not prove adequate in future generations of microprocessors.

SUMMARY OF INVENTION

It is an object of the present invention to provide an electrical connector that exhibits reduced stress levels at the solder joints.

It is a further object of the present invention to provide an electrical connector capable of accommodating mismatches in the coefficients of thermal expansion (CTE) of the various material used in the electronic device.

It is a further object of the present invention to provide a socket that does not transmit forces caused by actuation of the socket to the solder joints.

It is a further object of the present invention to provide an electrical connector having satisfactory coplanarity.

It is a further object of the present invention to provide an electrical connector with improved manufacturability.

It is a further object of the present invention to provide an electrical connector exhibiting improved mold flow characteristics.

It is a further object of the present invention to provide an electrical connector with improved reliability.

It is a further object of the present invention to provide an electrical connector that exhibits greater flexibility.

It is a further object of the present invention to provide an electrical connector with a contact housing having greater compliancy.

It is a further object of the present invention to provide an electrical connector modularly assembled from several components.

It is a further object of the present invention to provide an electrical connector formed from loosely coupled components.

It is a further object of the present invention to provide an electrical connector having a reduced mating height.

These and other objects of the present invention are achieved in one aspect of the present invention by an electrical connector, comprising: a frame; a housing having a contact extending therethrough and secured to the frame; and a cover secured to the frame and movable relative to the housing between a first position and a second position.

These and other objects of the present invention are achieved in another aspect of the present invention by a socket for connecting an electrical component to a substrate, comprising: a housing; a frame mountable to the substrate and supporting the housing; a cover movably secured to the frame between a first and a second position; and an insert mountable to said opening in said cover. The housing includes: a contact mountable to the substrate and adapted to engage a terminal of the electrical component; and guidance structure. The cover includes an opening. The insert includes guidance structure corresponding to the guidance structure on the housing so that the insert aligns with the housing.

These and other objects of the present invention are achieved in another aspect of the present invention by an electrical system, comprising: an electrical component having a terminal; a substrate having a conductive element; and an electrical connector mounted to the substrate and adapted to removably secure the electrical component to the substrate. The connector comprises housing; a frame mountable to the substrate and supporting the housing; and a cover movably secured to the frame between a first and a second position. The housing includes: a contact mounted to the substrate and adapted to engage a terminal of the electrical component, and guidance structure. The cover includes an opening. The insert mounts to the opening in the cover and includes guidance structure corresponding to the guidance structure on the housing so that the insert aligns with the housing.

BRIEF DESCRIPTION OF THE DRAWINGS

Other uses and advantages of the present invention will become apparent to those skilled in the art upon reference to the specification and the drawings, in which:

FIG. 1b is a bottom perspective view of the electrical connector in FIG. 1a;

FIG. 2 is an exploded view showing the various components of the electrical connector in FIG. 1a;

FIG. 3a is a top perspective view of one sub-assembly of the electrical connector in FIG. 1a;

FIG. 3b is a bottom perspective view of the sub-assembly in FIG. 3a;

FIG. 4a is a top perspective view of one component of the electrical connector in FIG. 1a;

FIG. 4b is a bottom perspective view of the component in FIG. 4a;

FIG. 4c is a detailed plan view of the component in FIG. 4a;

FIG. 5a is a top perspective view of another component of the electrical connector in FIG. 1a;

FIG. 5b is another top perspective view of the component in FIG. 5a;

FIG. 6a is a top perspective view of another sub-assembly of the electrical connector in FIG. 1a;

FIG. 6b is a bottom perspective view of the sub-assembly in FIG. 6a;

FIG. 7a is a top perspective view of another component of the electrical connector in FIG. 1a; and FIG. 7b is a bottom perspective view of the component in FIG. 4a.

DETAILED DESCRIPTION OF THE PREFERRED EMBODIMENT

Figure 1A:
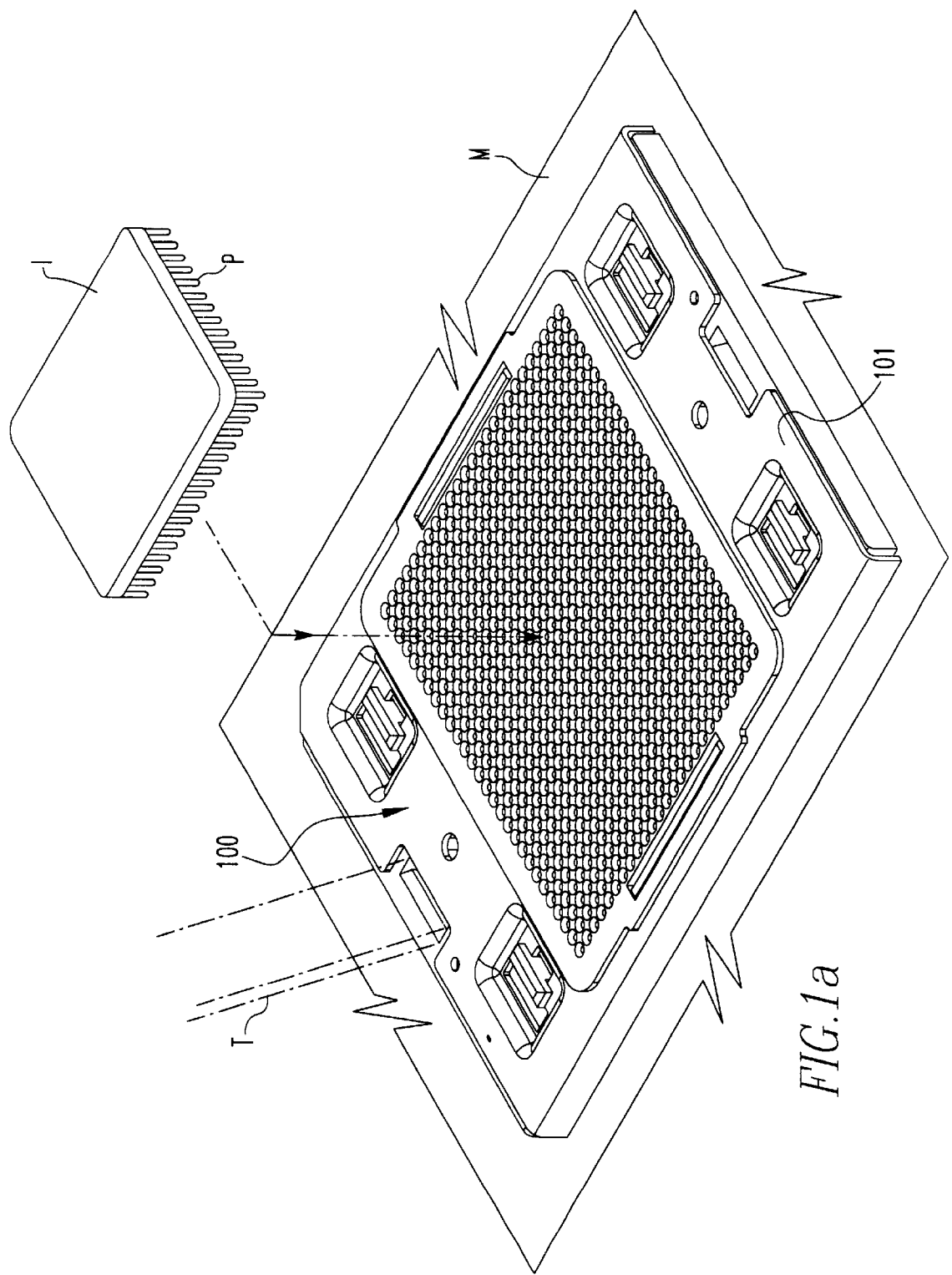
FIG. 1a is a top perspective view of an electrical connector of the present invention.
Figure 1B:
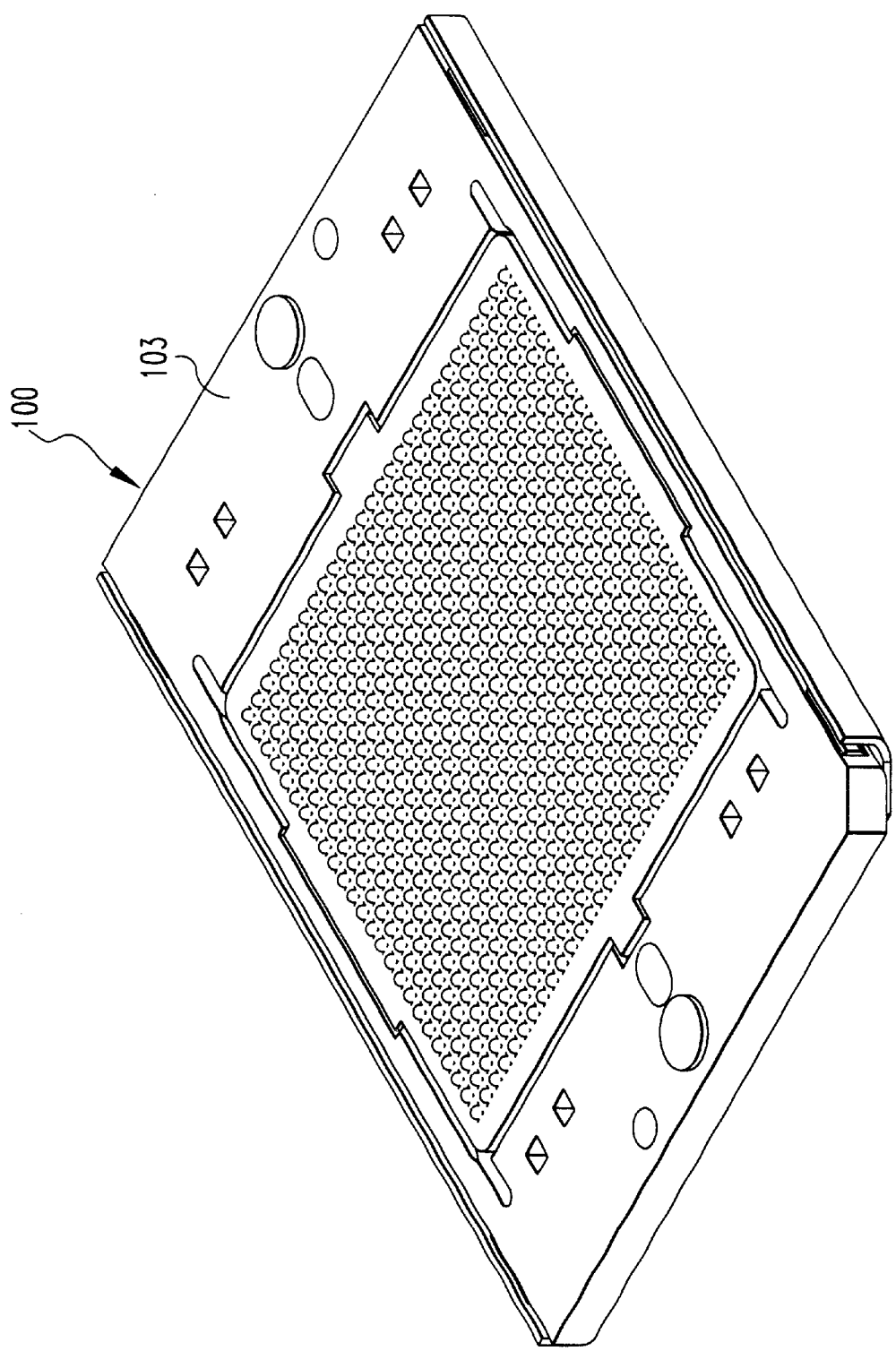

FIGS. 1a and 1b provide a top and a bottom perspective view, respectively, of an assembled electrical connector of the present invention. Generally speaking, the present invention is a socket 100 used to connect a first electrical component to a second electrical component. More specifically, socket 100 connects a microprocessor interposer I having pins P disposed in an array (e.g. PGA) to a motherboard M. Socket 100 preferably receives interposer pins P with zero insertion force.

Although the figures display socket 100 surface mounted to motherboard M, other mounting methods could be used. If, however, socket 100 is surface mounted as shown in the figures, ball grid array (BGA) technology is preferred.

Socket 100 is modular, made from several interengageable components. The components are designed to be flexible. When compared to a comparable unitary structure, the modular socket of the present invention is less rigid. Accordingly, the present invention can better handle stress build up caused by CTE differential between the various materials used in the interposer I, motherboard M and the socket. The present invention can also better handle stresses caused by the mating of the interposer pins P and the socket contacts than a comparable unitary structure.

A top 101 of socket 100 faces, and receives, interposer I. A bottom 103 of socket 100 faces, and mounts to, motherboard M. Although the various figures demonstrate socket 100 as being actuated by a hand tool T, such as a screwdriver, other actuation mechanisms (e.g. a lever rotating an eccentric cam) could be used.

Figure 2:
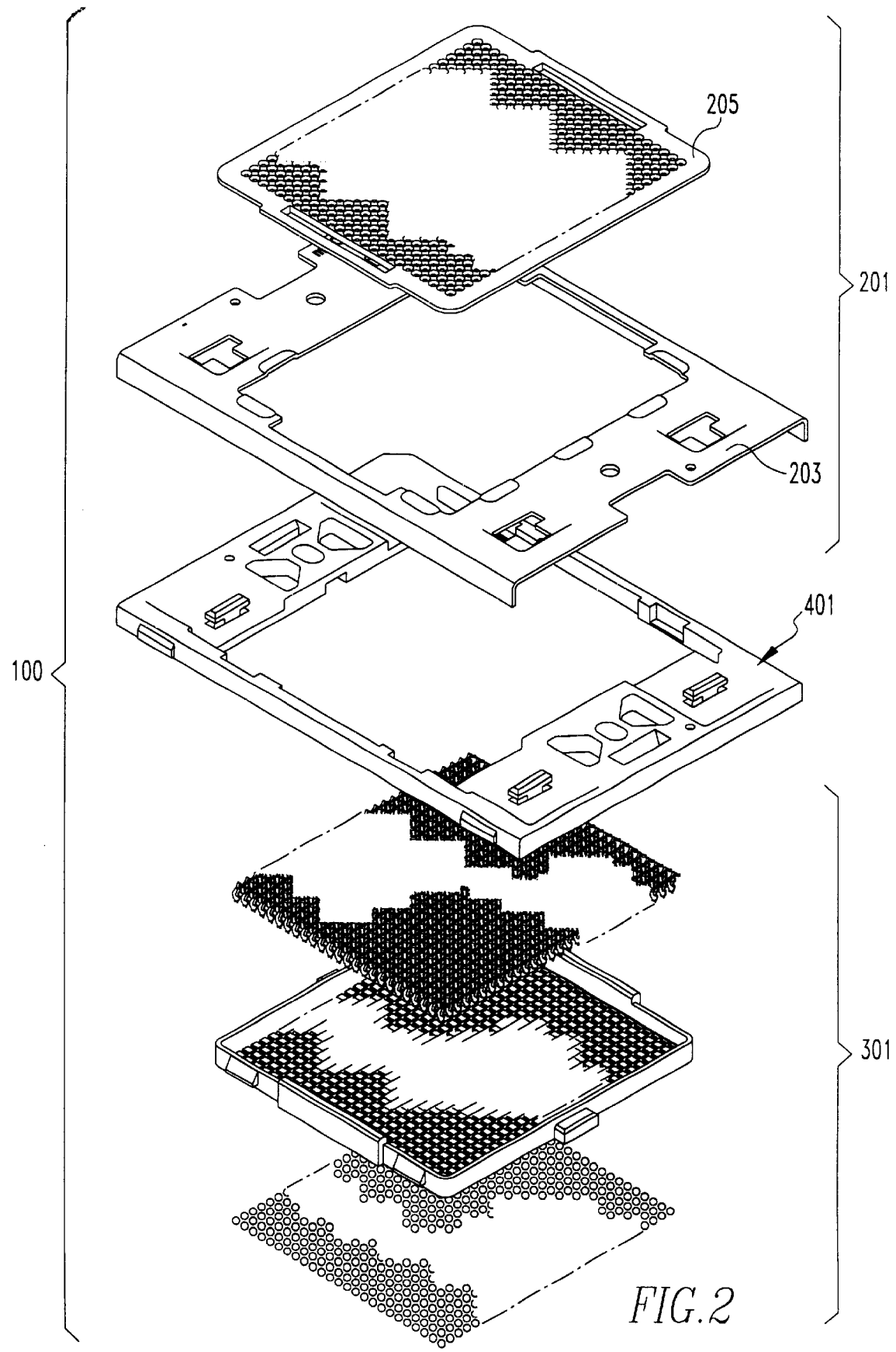

As seen in FIG. 2, numerous components form socket 100. Socket 100 could include, for example, a cover 203, an insert 205, contacts 303, contact housing 305, solder masses 307 and base frame 401. Cover 203 and insert 205, when assembled together, form cover sub-assembly 201. Contacts 303, housing 305 and solder masses 307, when assembled together, form contact housing sub-assembly 301. As described in more detail below, assembly of socket 100 involves placing contact housing sub-assembly 301 into base frame 401, then securing cover sub-assembly 201 over base frame 401.

Rather than rigidly assembling all of the sub-assemblies together, the present invention loosely couples the sub-assemblies. In other words, the sub-assemblies are not interference fit together. Rather, the various surfaces of the sub-assemblies abut without interference.

Without interference fitting, the present invention encourages some movement between the sub-assemblies. The relative movement of the sub-assemblies as a result of the aforementioned loose coupling helps absorb the stress caused by CTE differential and by the mating of interposer pin P and contacts 303. Whereas a rigid socket would transmit the stresses to the solder joint, a loosely coupled connector does not transmit all of the forces between connected components. Rather, the loosely coupled components individually absorb any stresses. Any stress that might be transmitted between adjacent components is generally an insignificant amount.

The movement between loosely coupled components, while large enough to prevent stress build up in the solder joints, should also be sufficiently small to ensure and maintain proper orientation between the respective sub-assemblies.

Figure 3A:
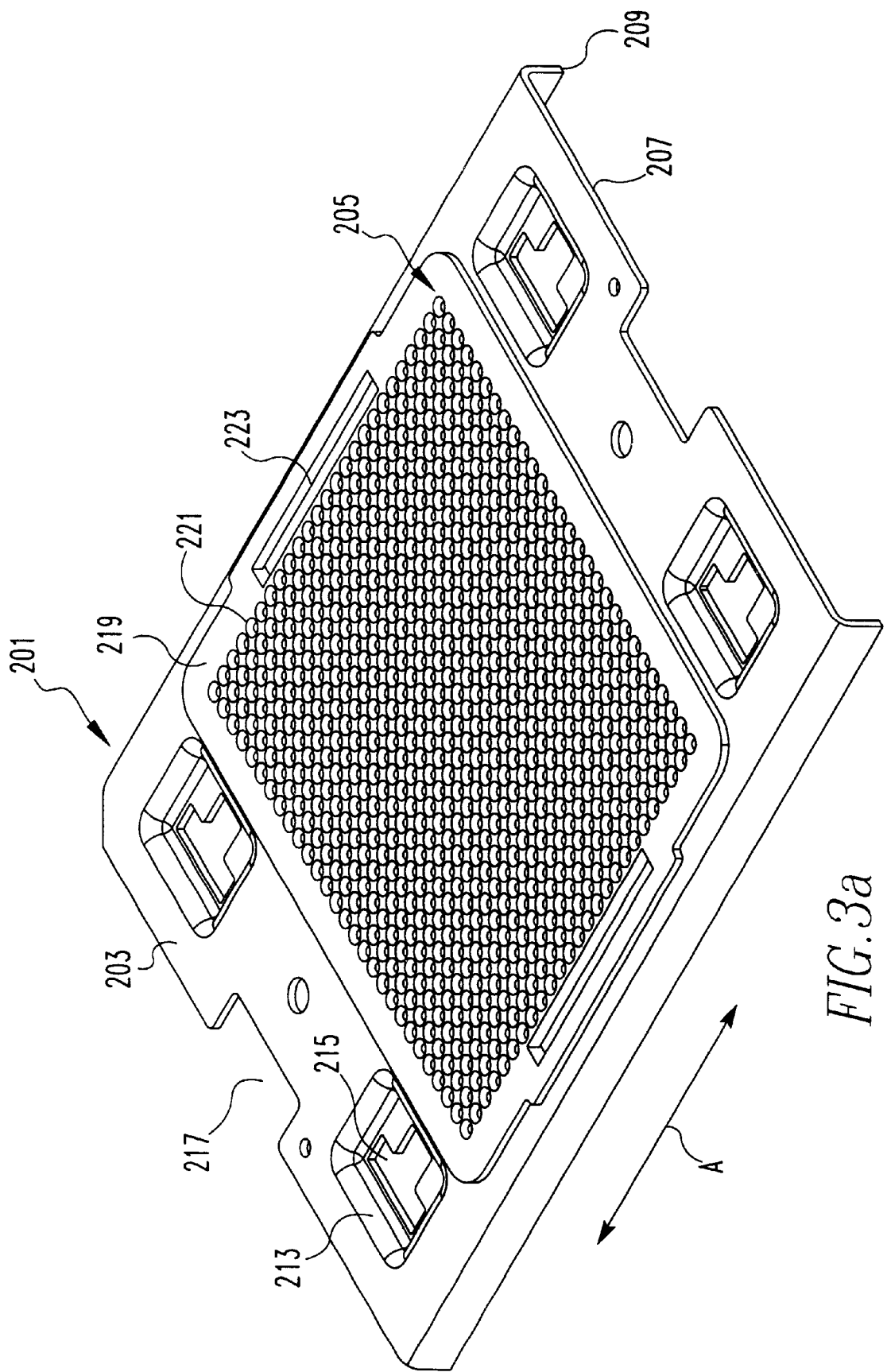
Figure 3B:
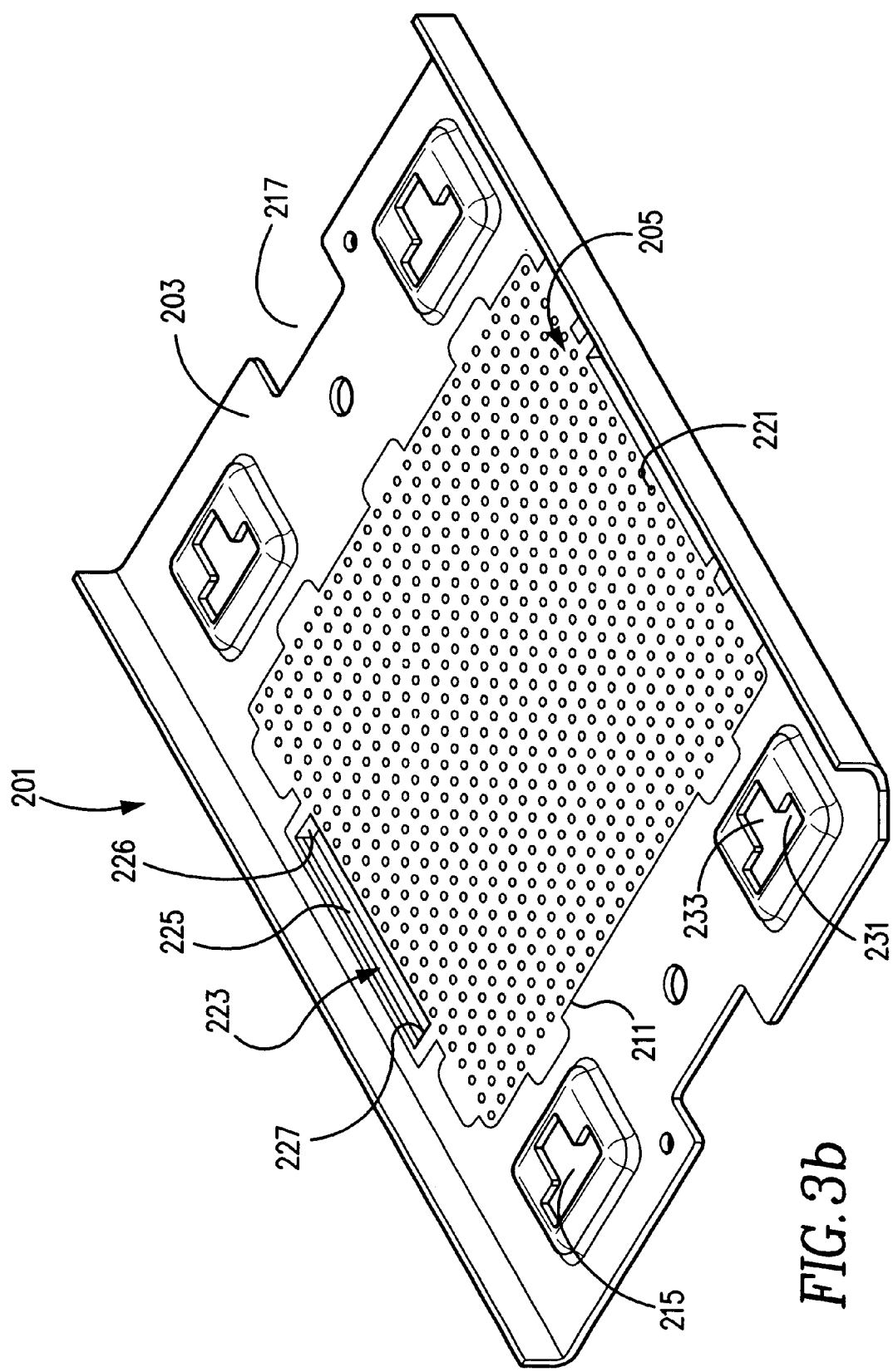

FIGS. 3a and 3b display cover 203, which is preferably stamped and formed from a suitable metal. Although metal is preferred in situation where a short mating height is required, other materials, including insulative materials, could be used.

Bending cover 203 along both sides creates an upper wall 207 and sidewalls 209. Since cover 203 must move across base frame 401, the longitudinal axes of sidewalls 209 define the actuation direction indicated by line A.

Upper wall 207 has a central opening 211 that receives insert 205. Preferably, insert 205 is molded around opening 211. However, other methods of making insert 205 are possible. For example, insert 205 could be molded separately from cover 203, then latched into cover 203 in a fashion similar to the latching arrangement of contact housing sub-assembly 301 and base frame 401 discussed in more detail below.

Upper wall 207 also has depressed regions 213. Depressed regions 213 include an aperture 215 and help retain cover 203 on base frame 401. As shown in FIGS. 3a and 3b, aperture 215 preferably has a T-shape, with enlarged portions 231 and a smaller portion 233.

Opposed edges of upper wall 207 include notches 217. Notches 217, conjunction with openings in base frame 401, allow tool T to actuate socket 100 between an open and a closed position.

FIGS. 3a and 3b display insert 205. Preferably, insert is made from a suitable insulative material such as a high temperature thermoplastic like a liquid crystal polymer (LCP). Insert 205 has a base 219 with plurality of apertures 221 extending therethrough. Apertures 221 are large enough to allow interposer pins P to pass freely therethrough without interference, but are small enough to provide lateral support to interposer pin P during mating with contacts 303.

The pattern of apertures 221 on cover 201 corresponds to the pattern of interposer pins P. The present invention could, however, have patterns arranged differently than that shown in FIG. 3a in order to receive other interposers (such as an interposer with an interstitial pin grid array).

If designed for one specific interposer, the number of apertures 221 preferably equals the number of interposer pins P. In order to, for example, accommodate interposers with differing pin counts, socket 100 could have more apertures 221 than interposer pins P.

Figure 4B:
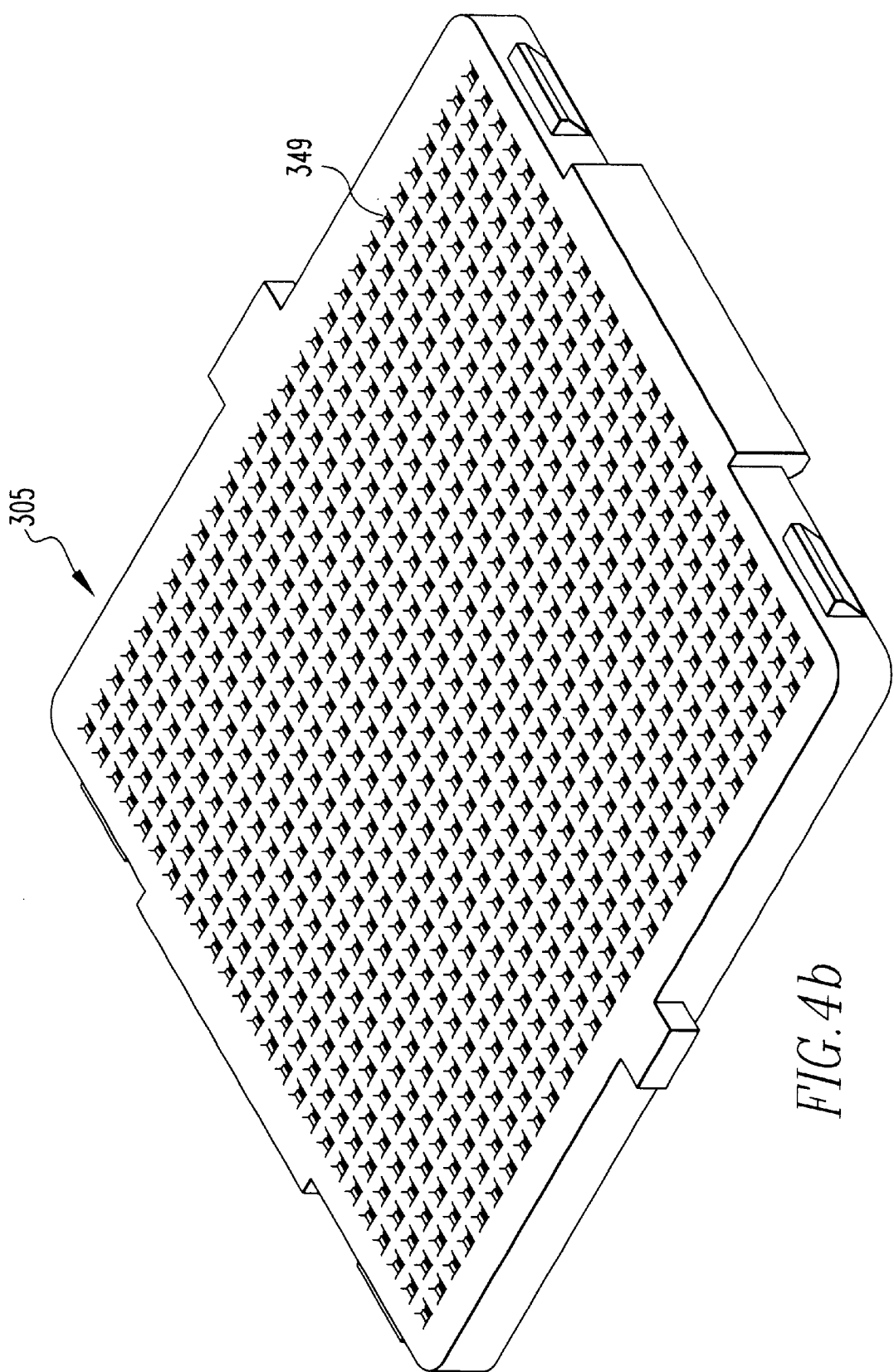
Figure 4C:
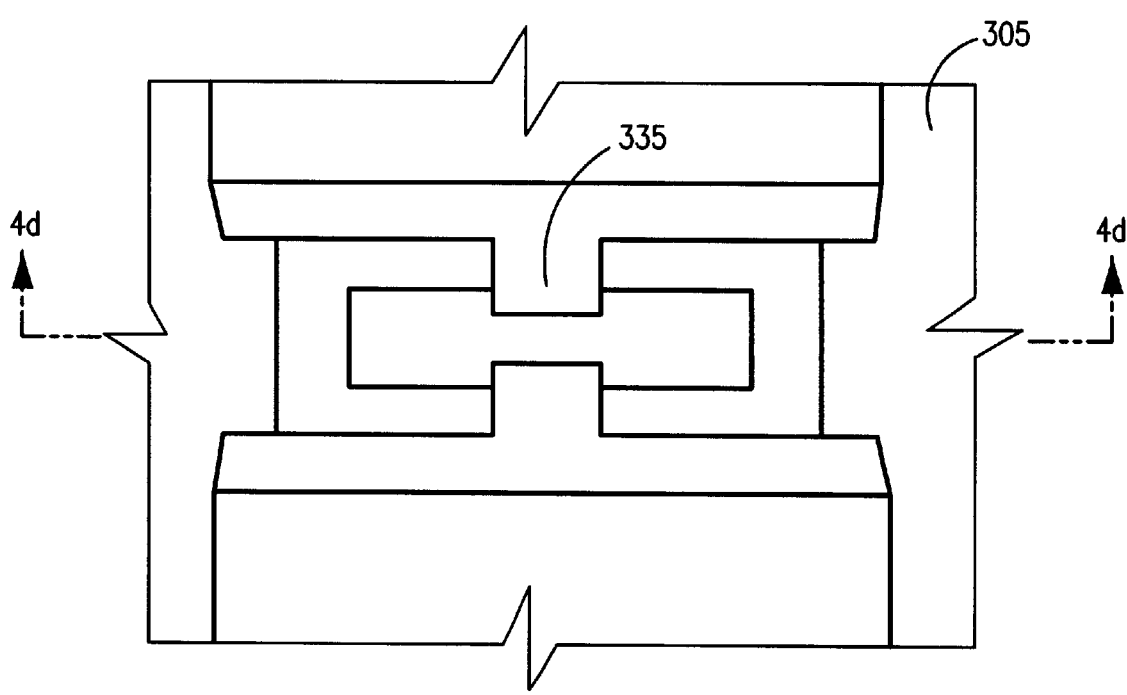
Figure 4D:
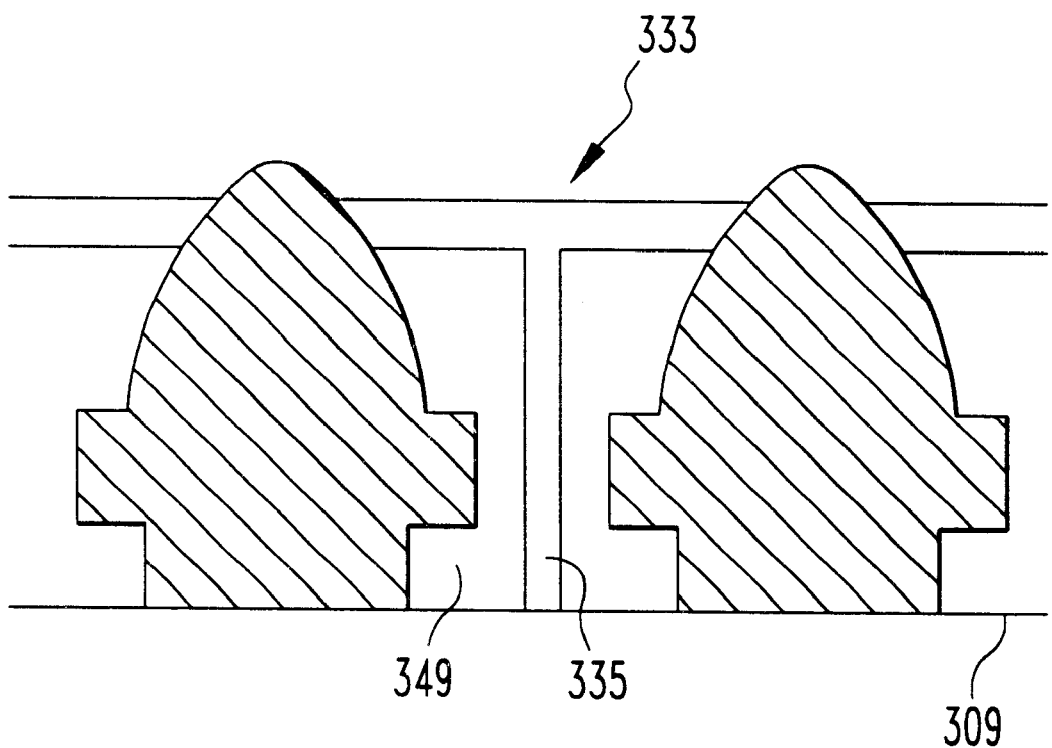
FIG. 4d is a cross-sectional view of the component in FIG. 4c taken along line 4d—4d.

Insert 205 also includes keyways 223 aligned with the actuation direction designated by arrow A. Keyways 223 receive splines 341 (as shown in FIG. 4a) from contact housing 305. A guide surface 225 extends in the actuation direction. Opposed stop surfaces 226, 227 flank guide surface 225.

Guide surface 225 abuts, without interference, a corresponding guide surface 343 (as shown in FIG. 4a) on the splines of contact housing 305. This interaction ensures proper alignment of contact housing 305 (and, necessarily, contacts 303) with insert 205 (and, necessarily, interposer pins P).

Stop surfaces 226, 227 abut corresponding stop surfaces 345, 347 (as shown in FIG. 4a) on the splines of contact housing 305. In the open position, stop surface 226 abuts the corresponding stop surface. In the closed position, stop surface 227 abuts the corresponding stop surface. In other words, the stop surfaces determine the travel of cover sub-assembly 201 across base frame 401 and define the open and closed positions.

FIGS. 4a–4d display contact housing 305. Preferably made from a suitable insulative material such as a high temperature thermoplastic, housing 305 includes a base 309 and a peripheral wall 311. Base 309 includes an array of apertures 333 which accept contacts 303. Apertures 333 have tapered sidewalls to limit the insertion of contact 303. The end of aperture 333 adjacent motherboard M could have an enlarged recess 349. Recess 349 would allow a portion of solder mass 307 to reside therein when secured to contact 303.

A pair of the opposed sidewalls that form aperture 333 can each include a deformable rib 335. Preferably, the deformable ribs 335 are centrally located along the sidewalls. Deformable rib 335 engages contact 303 upon insertion into aperture 333.

Peripheral wall 311 includes features that help retain contact housing 305 within base frame 401. Opposed sides of wall 311 include latch structure 337. Latch structure 337 engages a corresponding latch on base frame 401. Latch structure 337 includes a tapered surface 351 and a bottom surface 353.

Other opposed sides of wall 311 include keys 339. Keys 339 reside within corresponding notches in base frame 401 without interference. Keys 339, in conjunction with notches, help align contact housing sub-assembly 301 and base frame 401. Each key 339, and the corresponding notch, could have a different size in order to allow contact housing sub-assembly 301 to engage base frame 401 in only one orientation.

Peripheral wall 311 also includes features that align contact housing sub-assembly 301 and cover assembly 201. Opposed sides of wall 311 have splines 341 extending upwardly therefrom. Splines 341 extend past the upper surface of wall 311 in order to reside within keyways 223.

Splines 341 include a guide surface 343 flanked by opposed stop surfaces 345, 347. As discussed earlier, guide surface 343 abuts guide surface 225 of insert 205, without interference, to align contact housing sub-assembly 301 and cover assembly 201 also, stop surfaces 345, 347 abut corresponding stop surfaces 227, 229 on insert 205 to define the open and closed positions of socket 100.

Figure 5A:
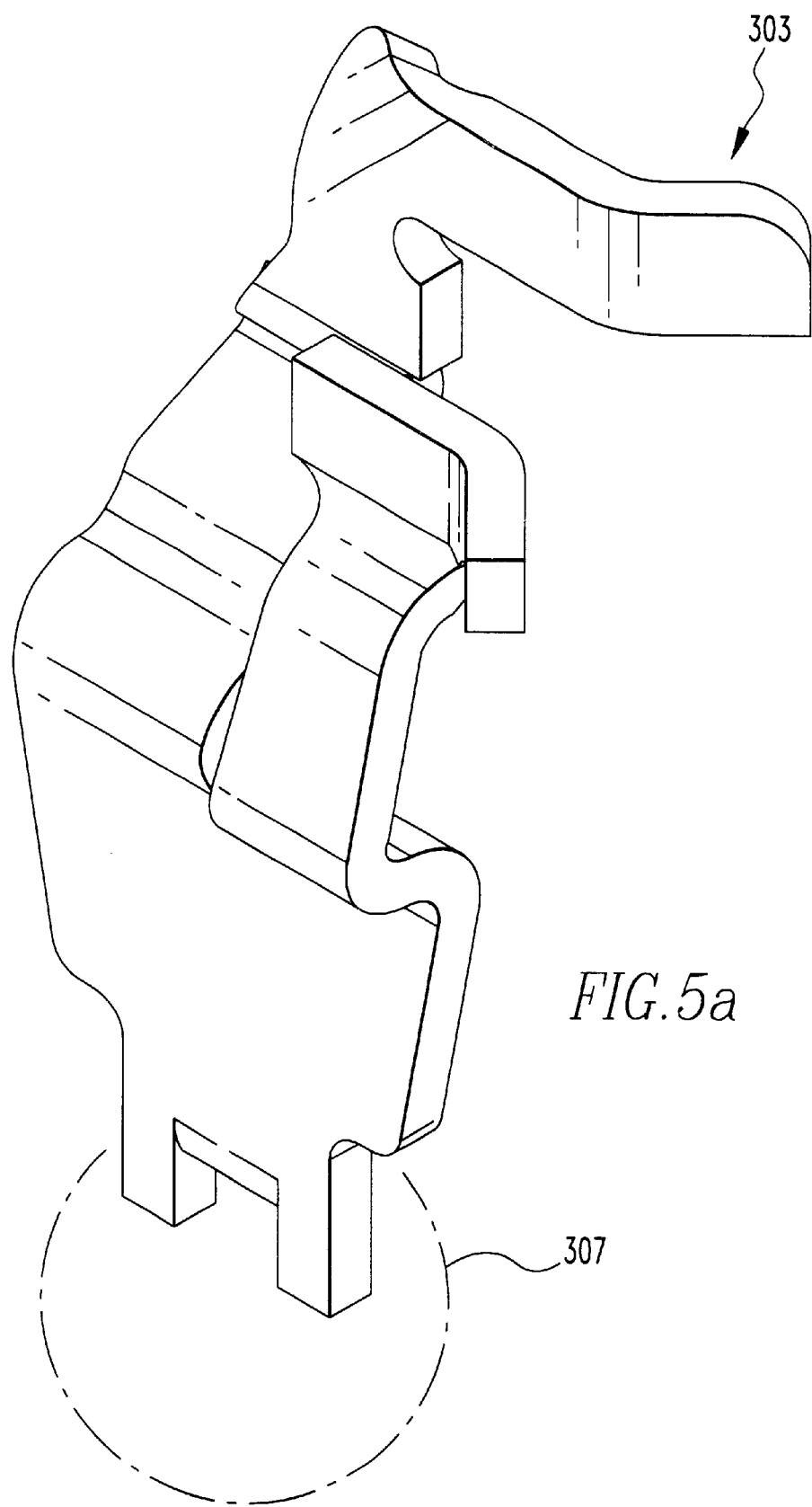
Figure 5B:
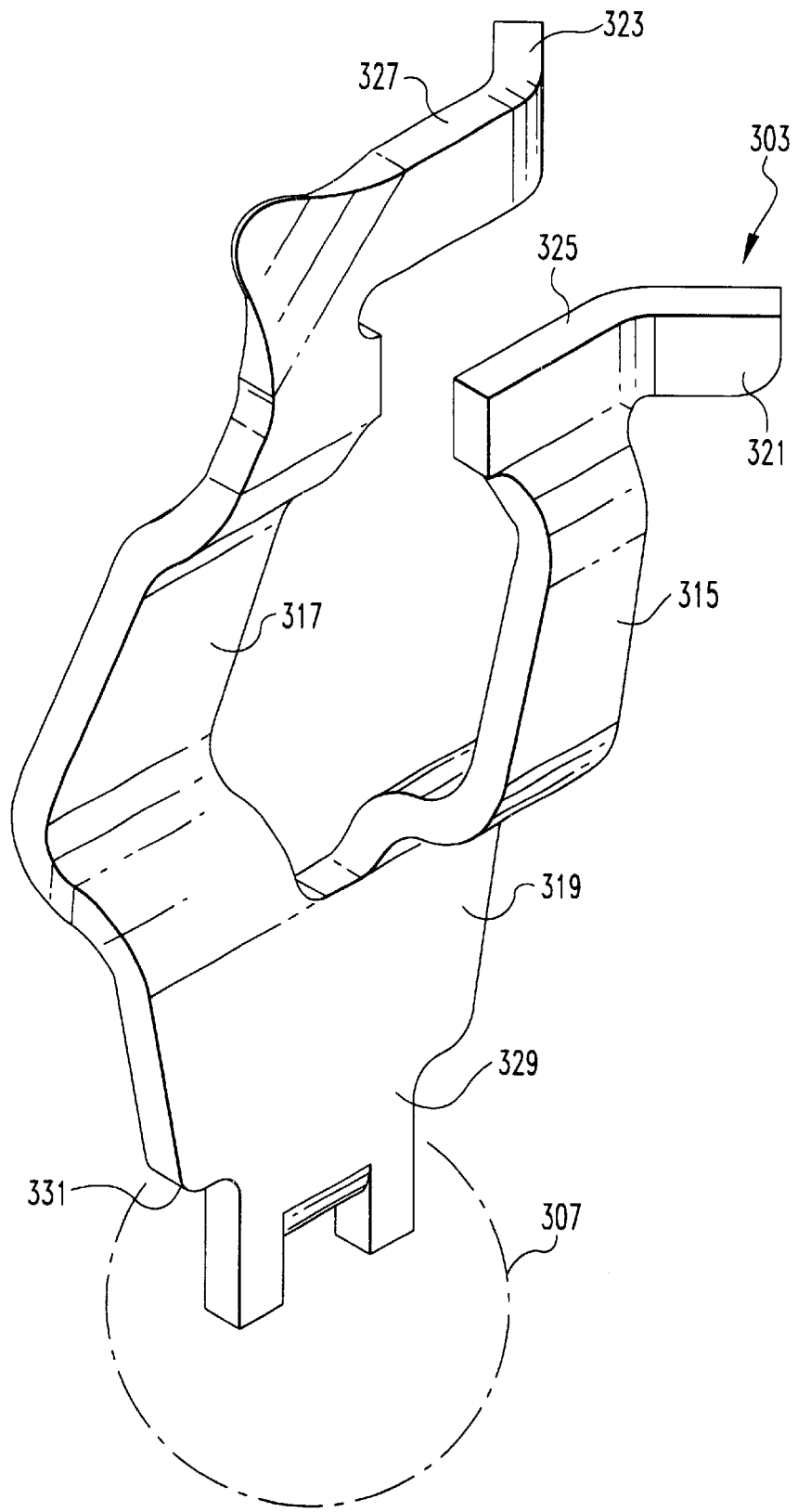
Figure 5C:
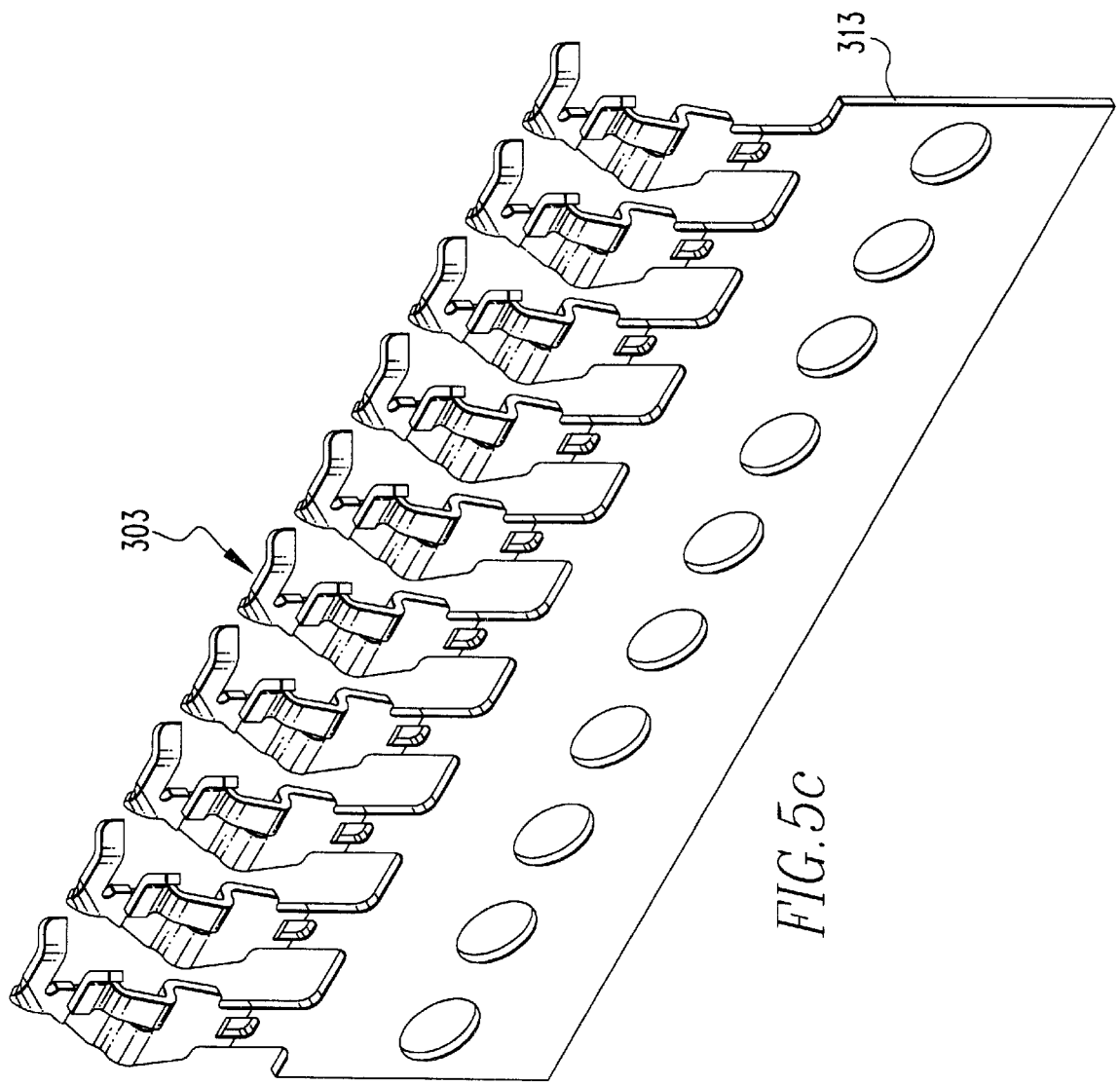
FIG. 5c is a top perspective view of the component in FIG. 5a partially assembled.

FIGS. 5a–5c display contact 303. As seen in FIG. 5c, contact 303 is preferably stamped and formed from a carrier strip 313 made from a suitable conductive material such as a copper alloy.

Contact 303 has dual beams 315,317 extending from one end of a base section 319. Each beam 315, 317 has a respective lead-in portion 321,323 between which interposer pin P enters when socket 100 receives interposer I. Actuation of socket 100 towards a closed position moves interposer pin P towards respective mating portions 325,327 of beams 315, 317. Mating portions 325, 327 engage opposite sides of interposer pin P.

As seen in FIG. 5a, beam 315 is shorter than beam 317. Although engaging opposite sides of interposer pin P, beams 315,317 engage pin P at a different elevations. In order to balance the spring rates of beams 315, 317, the width of long beam 317 can be greater than the width of short beam 315.

A mounting section 329 extends from an opposite end of base section 319 and is flanked by a pair of shoulders 331. Preferably, mounting section 329 is a surface mount section. Although any surface mount termination could be used, FIGS. 5a and 5b show the preferred contact 303 capable of surface mounting to motherboard M using BGA technology. Furthermore, other mounting techniques (e.g. pin-in-paste, press-fit) could be used. International Publication numbers WO 98/15989 and WO 98/15991, herein incorporated by reference, describe methods of securing a solder mass 307, such as a fusible solder ball, to a contact retained by an insulative housing and to a pad on a circuit substrate.

The assembly of contact housing sub-assembly 301 will now be described. First, contacts 303 are inserted into apertures 333 in housing 305. Insertion is complete when shoulders 331 abut a correspondingly shaped feature in aperture 333. In that position, beams 315,317 extend upwardly from housing 305 and mounting portion 329 extends downwardly from housing 305.

Figure 6A:
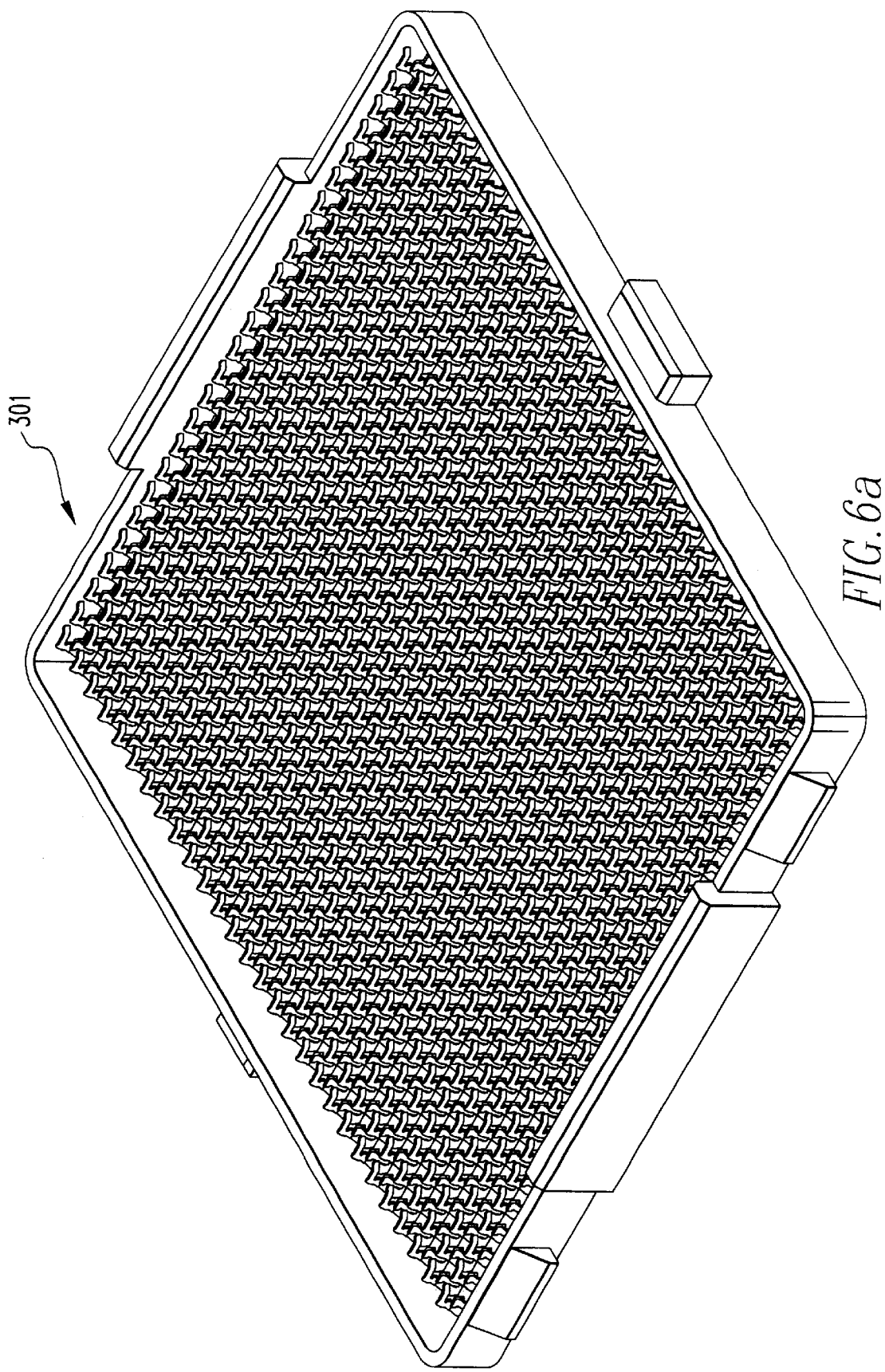
Figure 6B:
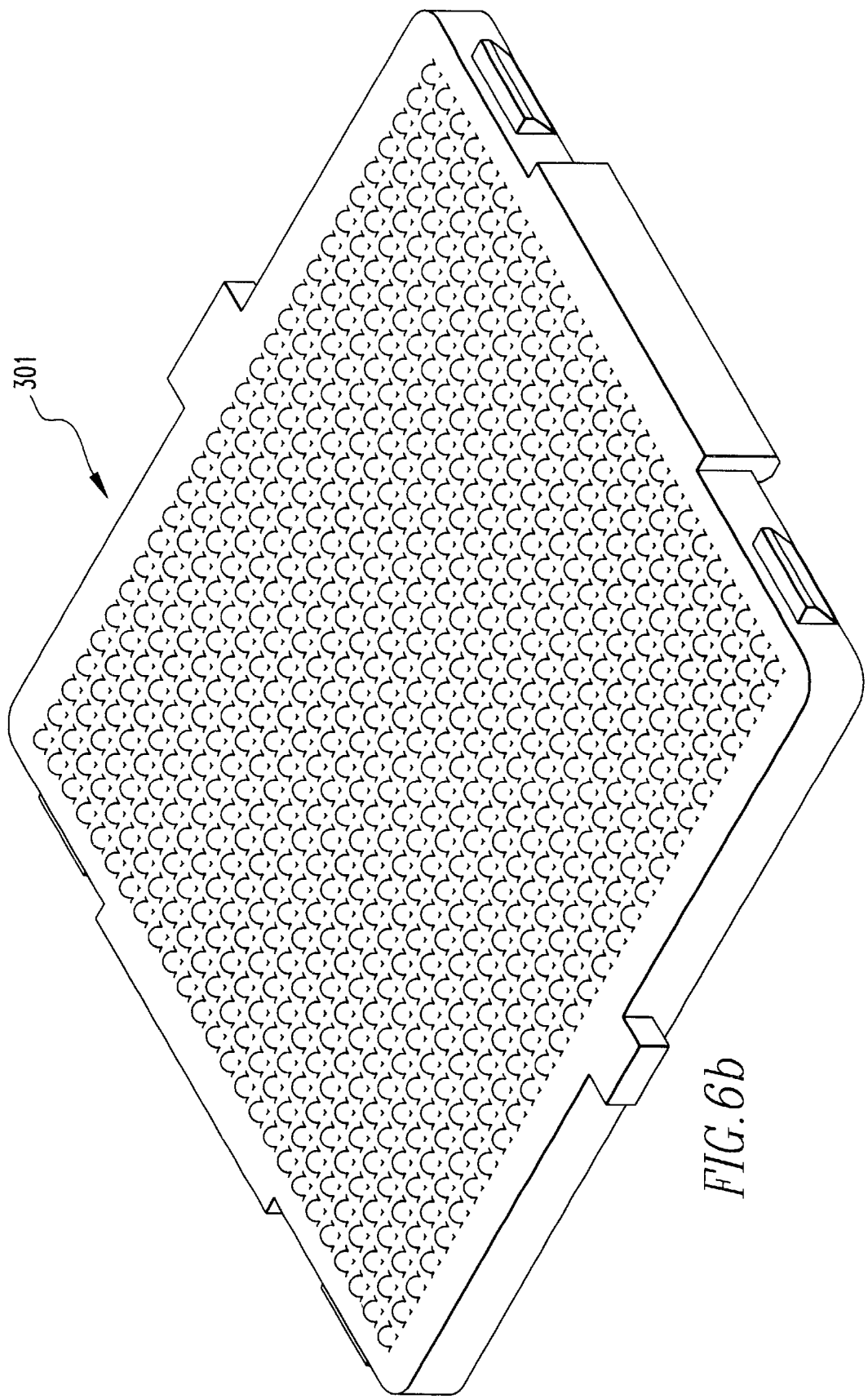

Next, solder mass 307 is secured to contact 303 using, for example, the reflow techniques described in International Publication numbers WO 98/15989 and WO 98/15991. The combination of shoulder 331 of contact 303 abutting the surface of aperture 333 and of solder mass 307 securing to mounting end 329 of contact 303 serves to hold contact housing sub-assembly 301 together. FIGS. 6a and 6b display an assembled contact housing sub-assembly 301.

Figure 7B:
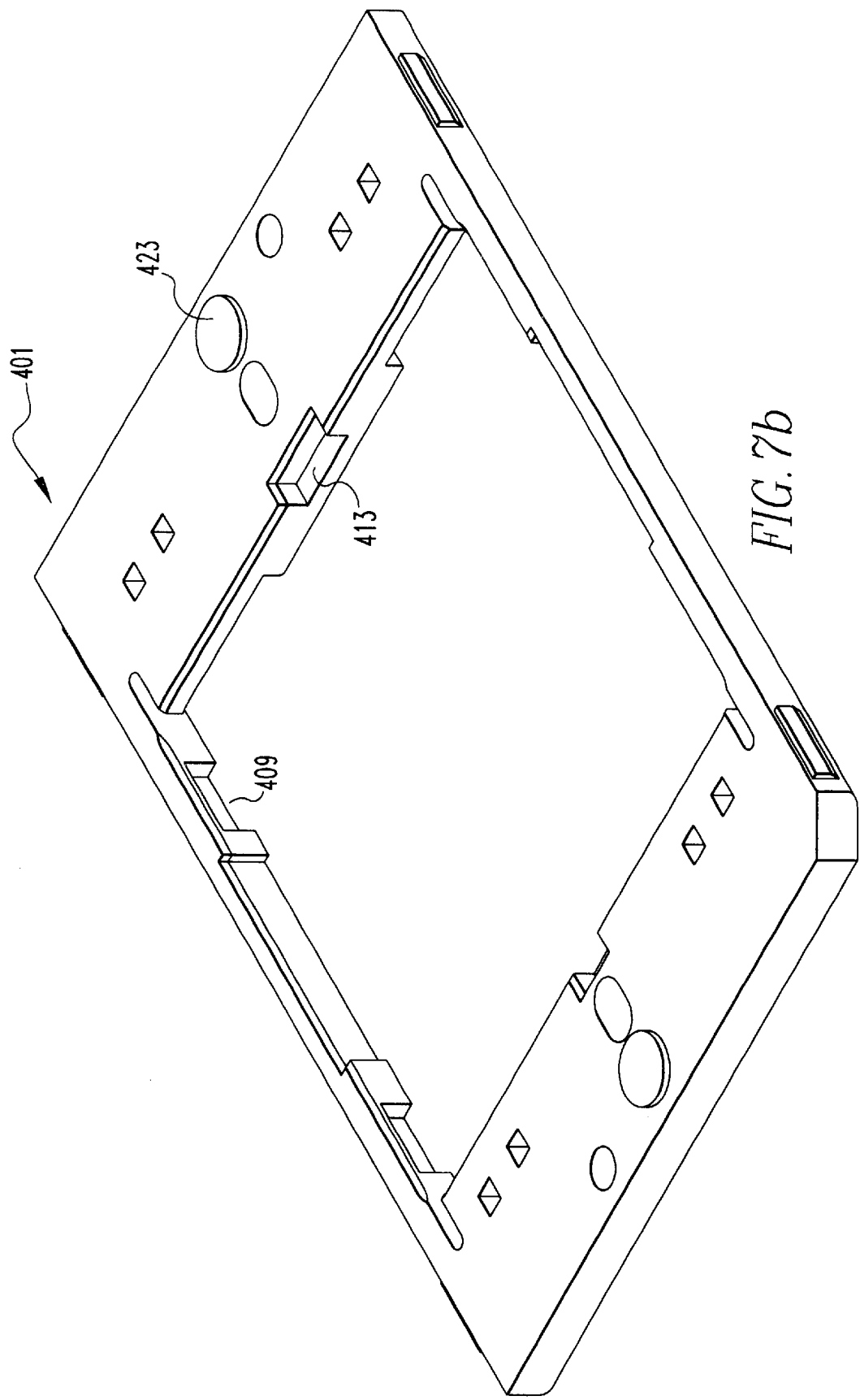

FIGS. 7a and 7b display base frame 401. Base frame 401, formed from a suitable insulative material such as a high temperature thermoplastic, has a generally rectangular shape. Base frame 401 has a central opening 403 in which contact housing sub-assembly 301 resides upon assembling socket 100.

Sidewalls 405 that define central opening 403 include features that help retain contact housing sub-assembly 301 in base frame 401. Sidewalls 405 include pockets 409. A bottom surface 411 helps define pocket 409. Pockets 409 reduce the thickness of sidewall 405 so that, in these areas, sidewall 405 acts like a latch.

During initial insertion of contact housing sub-assembly 301 into base frame 401, tapered surface 351 of contact housing 305 engages bottom surface 411 of sidewall 405. Accordingly, sidewall 405 deflects upon further insertion of contact housing sub-assembly 301. Once tapered surface 351 passes bottom surface 411, sidewall 405 resiles to its original position. At this position, bottom surface 411 of sidewall 405 abuts bottom surface 353 of contact housing 305 without interference. This prevents contact housing sub-assembly from exiting base frame 401 in one direction.

Sidewalls 405 also have elongated slots 407. Slots 407 receive splines 341 without interference. Slots 407 help align contact housing sub-assembly 301 within base frame 401.

Base frame 401 also includes channels 413 on a lower surface. Channels 413 receive blocks 339 of contact housing 305. Channels 413 prevent contact housing sub-assembly 301 from exiting base frame 401 in 15 one direction. Channels 413, in conjunction with the latch feature of sidewalls 405, serve to prevent contact housing sub-assembly 301 from exiting base frame 401 after insertion. Channels 413 and the latch features do not, however, interference fit contact housing sub-assembly 301 and bases frame 401 together.

Base frame 401 includes posts 415 extending upwardly therefrom. Posts 415 retain cover sub-assembly 201 on base frame 401. Posts 415 include a body portion 417 and an enlarged head 419. In order to secure cover sub-assembly 201 to base frame 401, enlarged heads 419 are extended through enlarged portions 231 of apertures 215. Then, cover sub-assembly is slid along base frame 401 until enlarged heads 419 are positioned over smaller portions 233 of apertures 215.

At this point of assembly, cover sub-assembly 201 cannot be removed unless cover 203 is slid so that enlarged heads 419 and enlarged portions 231 of aperture 215 align. However, once contact housing sub-assembly 301 is inserted into base frame 401, enlarged heads 419 and enlarged portions 231 of aperture 215 cannot align.

Base frame 401 includes an opening 421 which can receive tool T. Opening 421 acts as a leverage point to drive cover sub-assembly 201 across base frame 401 between the open and closed positions.

The bottom surface of base frame 401 also includes solder pads 423 for surface mounting to motherboard M. As discussed earlier, if a technique other than surface mounting is used, solder pads 423 may not be required.

The assembly of socket 100 will now be described. First, the sub-assemblies are built as discussed above. Second, cover sub-assembly 201 is secured to base frame 401 by engaging posts 415 with openings 215. Finally, contact housing sub-assembly 301 is inserted into central opening 403 of base frame 401. During insertion, splines 341 of contact housing sub-assembly 301 enter keyways 223 of cover sub-assembly 201.

Once fully assembled, socket 100 can receive interposer I. Interposer pins P enter apertures 221 in insert 205. Socket 100 can now be actuated from an open to a closed position. In the closed position, contacts 303 engage interposer pins.

Due to the loose coupling of the components of socket 100, the components generally absorb most of the stresses caused by CTE differential and the mating process. The components typically prevent stress build-up in the solder joints.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A socket for connecting an electrical component to a substrate, comprising:
    a housing, including:
        a contact mountable to the substrate and adapted to engage a terminal of the electrical component; and
        a housing guidance structure;
    a frame mountable to the substrate and supporting said housing;
    a cover movably secured to said frame between a first position and a second position, and including an opening; and
    an insert mountable to said opening in said cover and including an insert guidance structure corresponding to said housing guidance structure so that said insert aligns with said housing.

2. The socket of claim 1, wherein said cover includes openings therein and said frame includes projections extending into said openings to retain said cover on said frame.

3. The socket of claim 1, wherein said cover includes openings therein and said frame includes projections extending into said openings to retain said cover on said frame.

4. The socket of claim 3, wherein said projection has a body and an enlarged head, and said opening has a T-shape.

5. The socket of claim 1, wherein said insert guidance structure comprises at least one slot and said housing guidance structure comprises at least one block located within said at least one slot.

6. The socket of claim 5, wherein said at least one slot includes opposed first and second stop surfaces and said at least one block includes opposed first and second stop surfaces, wherein, in said first position, said stop surface of said at least one slot abuts said first stop surface of said at least one block, and in said second position, said second stop surface of said at least one slot abuts said second stop surface of said at least one block.

7. The socket as recited in claim 1, further comprising a solder mass secured to said contact.

8. The socket as recited in claim 7, wherein said solder mass is a fusible element.

9. The socket as recited in claim 7, wherein said solder mass is a solder ball.

10. An electrical system, comprising:
    an electrical component having a terminal;
    a substrate having a conductive element; and
    an electrical connector mounted to said substrate and adapted to removeably secure said electrical component to said substrate, said connector comprising:
        a housing, including:
            a contact mounted to said substrate and adapted to engage a terminal of said electrical component, and
            a housing guidance structure;
        a frame mountable to said substrate and supporting said housing; and
        a cover moveably secured to said frame between a first and a second position, and including an opening; and
        an insert mountable to said opening in said cover and including an insert guidance structure corresponding to said housing guidance structure so that said insert aligns with said housing.

11. The electrical system as recited in claim 10, wherein said substrate is a printed circuit board.

12. The electrical system as recited in claim 10, wherein said electrical component includes a microprocessor.

13. The electrical as recited in claim 12, wherein said electrical component is an interposer having an array of pins extending therefrom.

14. A socket for connecting an electrical component to a substrate, comprising:
    a housing, including:
        a contact mountable to the substrate and adapted to engage a terminal of the electrical component; and
        a housing guidance structure including an upwardly extending projection;
    a frame mountable to the substrate and supporting said housing;
    a cover movably secured to said frame between a first position and a second position, and including an opening; and
    an insert mountable to said opening in said cover and including an insert guidance structure including an aperture that corresponds to said housing guidance structure so that said insert aligns with said housing.

15. The socket of claim 14 wherein the projection is a spline projecting upwardly from a portion of the housing.

16. The socket of claim 15 wherein the insert guidance aperture is a keyway, the spline being insertable into the keyway.

17. The electrical connector of claim 16 wherein the insert post contacts a portion of the frame to secure the frame and cover together.

18. An electrical connector comprising:
    a frame;
    a housing having a contact extending therethrough, said housing being disposed in said frame such that the housing and the frame do not form an interference fit; and a cover assembly including an insert and a cover member, the insert being translateably moveable relative to said housing and to said frame between a first position to a second position and disposed in said cover member;

whereby the non-interference fit between the housing and the frame, and the capability of movement between the insert and the frame and the housing, diminishes component stress during operation caused by differential coefficients of thermal expansion.

* * * * *